United States Patent
Lille et al.

(10) Patent No.: US 10,460,801 B2
(45) Date of Patent: *Oct. 29, 2019

(54) MULTI-LEVEL PHASE CHANGE DEVICE

(71) Applicant: Western Digital Technologies, Inc., San Jose, CA (US)

(72) Inventors: Jeffrey Lille, Sunnyvale, CA (US); Luiz M. Franca-Neto, Sunnyvale, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/017,806

(22) Filed: Jun. 25, 2018

(65) Prior Publication Data

US 2018/0308547 A1    Oct. 25, 2018

Related U.S. Application Data

(60) Continuation of application No. 15/406,221, filed on Jan. 13, 2017, now Pat. No. 10,020,053, which is a
(Continued)

(51) Int. Cl.
    *G11C 13/00* (2006.01)
    *H01L 45/00* (2006.01)
    (Continued)

(52) U.S. Cl.
    CPC ...... *G11C 13/0069* (2013.01); *G11C 11/5678* (2013.01); *G11C 13/0004* (2013.01);
    (Continued)

(58) Field of Classification Search
    CPC . H01L 45/065; H01L 45/1233; H01L 45/126; H01L 45/143; H01L 45/144; H01L 45/148
    (Continued)

(56) References Cited

U.S. PATENT DOCUMENTS

| 794,320 A | 7/1905 | Sedgwick |
| 6,687,153 B2 | 2/2004 | Lowrey |

(Continued)

FOREIGN PATENT DOCUMENTS

WO    2014036480 A1    3/2014

OTHER PUBLICATIONS

Ashvini Gyanathan and Yee-Chia Yeo, Multi-Level Phase Change Memory Cells with SiN or Ta2O5 Barrier Layers <http://iopscience.iop.org/1347-4065/51/2S/02BD08/pdf/1347-4065_51_2S_02BD08.pdf>.

(Continued)

*Primary Examiner* — Ly D Pham
(74) *Attorney, Agent, or Firm* — Patterson & Sheridan, LLP; Steven H. Versteeg

(57) ABSTRACT

Embodiments of the present disclosure generally relate to electronic devices, and more specifically, to multi-level phase change devices. In one embodiment, a memory cell device is provided. The memory cell device generally includes a top surface, a bottom surface and a cell body between the top surface and the bottom surface. The cell body may include a plurality of phase change material layers, which may be used to store data of the cell. In another embodiment, a method of programming a memory cell is provided. The method generally may include applying a sequence of different pulses to each phase change material layer of the cell as the voltage of each pulse in the sequence is ratcheted down from the start of a write cycle to the end of a write cycle.

23 Claims, 6 Drawing Sheets

Related U.S. Application Data division of application No. 14/845,016, filed on Sep. 3, 2015, now Pat. No. 9,564,585.

(51) Int. Cl.
  *H01L 27/24* (2006.01)
  *G11C 11/56* (2006.01)

(52) U.S. Cl.
  CPC ...... *H01L 27/2436* (2013.01); *H01L 27/2445* (2013.01); *H01L 45/06* (2013.01); *H01L 45/065* (2013.01); *H01L 45/126* (2013.01); *H01L 45/1233* (2013.01); *H01L 45/1246* (2013.01); *H01L 45/141* (2013.01); *H01L 45/143* (2013.01); *H01L 45/144* (2013.01); *H01L 45/148* (2013.01); *G11C 13/0002* (2013.01); *G11C 2013/0092* (2013.01); *G11C 2213/51* (2013.01)

(58) Field of Classification Search
  USPC .............................. 365/163, 148; 257/2, 4, 5
  See application file for complete search history.

(56) References Cited

U.S. PATENT DOCUMENTS

| | | |
|---|---|---|
| 6,894,304 B2 | 5/2005 | Moore |
| 6,927,410 B2 | 8/2005 | Chen |
| 7,485,891 B2 | 2/2009 | Hamann et al. |
| 7,687,830 B2 | 3/2010 | Pellizzer et al. |
| 7,968,862 B2 | 6/2011 | Liu |
| 7,993,962 B2 | 8/2011 | Chen et al. |
| 8,017,930 B2 | 9/2011 | Philipp et al. |
| 8,173,987 B2 | 5/2012 | Lung |
| 8,373,151 B2 | 2/2013 | Parkinson |
| 8,530,875 B1 | 9/2013 | Chang et al. |
| 8,642,985 B2 | 2/2014 | Chen et al. |
| 8,716,780 B2 | 5/2014 | Kellam et al. |
| 8,841,649 B2 | 9/2014 | Pio |
| 2007/0158631 A1 | 7/2007 | Daley et al. |
| 2007/0221905 A1 | 9/2007 | Liu |
| 2008/0019257 A1 | 1/2008 | Philipp et al. |
| 2008/0048213 A1 | 2/2008 | Liu |
| 2008/0123397 A1 | 5/2008 | Liu |
| 2008/0142773 A1 | 6/2008 | Campbell |
| 2008/0273378 A1 | 11/2008 | Philipp et al. |
| 2009/0071836 A1 | 3/2009 | Huang et al. |
| 2009/0091971 A1 | 4/2009 | Dennison et al. |
| 2009/0180314 A1 | 7/2009 | Liu |
| 2010/0096609 A1 | 4/2010 | Kim et al. |
| 2011/0037042 A1 | 2/2011 | Breitwisch et al. |
| 2013/0270503 A1 | 10/2013 | Miao et al. |
| 2013/0306929 A1 | 11/2013 | Lee et al. |
| 2014/0131784 A1 | 5/2014 | Davis et al. |
| 2014/0160837 A1 | 6/2014 | Ahn |
| 2014/0273314 A1 | 9/2014 | Hashim |
| 2014/0293688 A1 | 10/2014 | Kim |
| 2014/0361239 A1 | 12/2014 | Ramaswamy et al. |

OTHER PUBLICATIONS

Raoux et al., Crystallization characteristics of Ge—Sb and Ge—Te phase change materials, http://www.epcos.org/library/papers/pdf_2009/Raoux%20et%20al%20Crystallization%20characteristics.pdf.

Taiwanese Office Action dated Apr. 11, 2017 for Taiwanese Patent Application No. 105120808 (9 pages).

GB UK Office Action dated Oct. 24, 2016 for GB UK Application No. GB1611062.9 (10 pages).

MULTI-LEVEL PHASE CHANGE DEVICE

CROSS-REFERENCE TO RELATED APPLICATIONS

This application is a continuation of co-pending U.S. patent application Ser. No. 15/406,221, filed on Jan. 13, 2017, which is a divisional application of U.S. patent application Ser. No. 14/845,016, filed on Sep. 3, 2015, and issued as U.S. Pat. No. 9,564,585, which are each incorporated herein by reference.

BACKGROUND

Field of the Disclosure

Embodiments presented in this disclosure generally relate to an electronic device, and more specifically, embodiments disclosed herein relate to a multi-level phase change device.

Description of the Related Art

Phase change memory (PCM) is a type of non-volatile memory technology. PCM is an emerging technology and a candidate for storage class memory (SCM) applications and a serious contender to dislodge NOR and NAND flash memory in solid state storage applications and, in the case of NAND flash, solid-state drives (SSDs). PCM functions based upon switching a memory cell, typically based on chalcogenides such as $Ge_2Sb_2Te_5$, between two stable states, a crystalline state and an amorphous state. Switching between the two states may be enabled by heating the memory cell, which is typically done by applying an electrical current through the PCM cell.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include, among others, achieving different final resistance states for a multi-level phase change device.

Aspects of the present disclosure generally relate to electronic devices, and more, particularly, to multi-level phase change devices.

One embodiment of the present disclosure provides a memory cell device that generally includes a top surface with a top electrode attached to the top surface, a bottom surface with a bottom electrode attached to the bottom surface, and a cell body between the top surface and the bottom surface. The cell body may generally include at least two alloys of a phase change material and a diffusion barrier. In addition, the at least two alloys may have different glass transition temperatures, may be separated by the diffusion barrier, may include different alloys of the same phase change material, and may be of different volumes.

Another embodiment of the present disclosure provides a method for programming a memory cell. The method generally includes applying a first pulse at a first voltage to a first phase change material layer of the memory cell. The method may also include applying a second pulse at a second voltage to the first phase change material layer of the memory cell, wherein the second voltage is lower than the first voltage, and wherein the first pulse and the second pulse are applied in order to set the memory cell in a first resistance state. The method may further include applying a third pulse at a third voltage to a second phase change material layer of the memory cell, wherein the third voltage is lower than the first voltage and the second voltage, and wherein the third pulse alters the memory cell from the first resistance state to a second resistance state.

Still another embodiment of the present disclosure provides a system. The system may generally include a storage device that includes a plurality of memory cells, and a selector to access each of the plurality of memory cells in the storage device. In addition, each of the memory cells may generally include a top surface with a top electrode attached to the top surface, a bottom surface with a bottom electrode attached to the bottom surface, and a cell body between the top surface and the bottom surface. The cell body may generally include at least two alloys of a phase change material and a diffusion barrier. In addition, the at least two alloys may have different glass transition temperatures, may be separated by the diffusion barrier, may include different alloys of the same phase change material, and may be of different volumes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Various aspects of the disclosure are described more fully hereinafter with reference to the accompanying drawings.

This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects. It should be noted that the figures discussed herein may not be drawn to scale and may not indicate actual or relative sizes.

Figure 1:
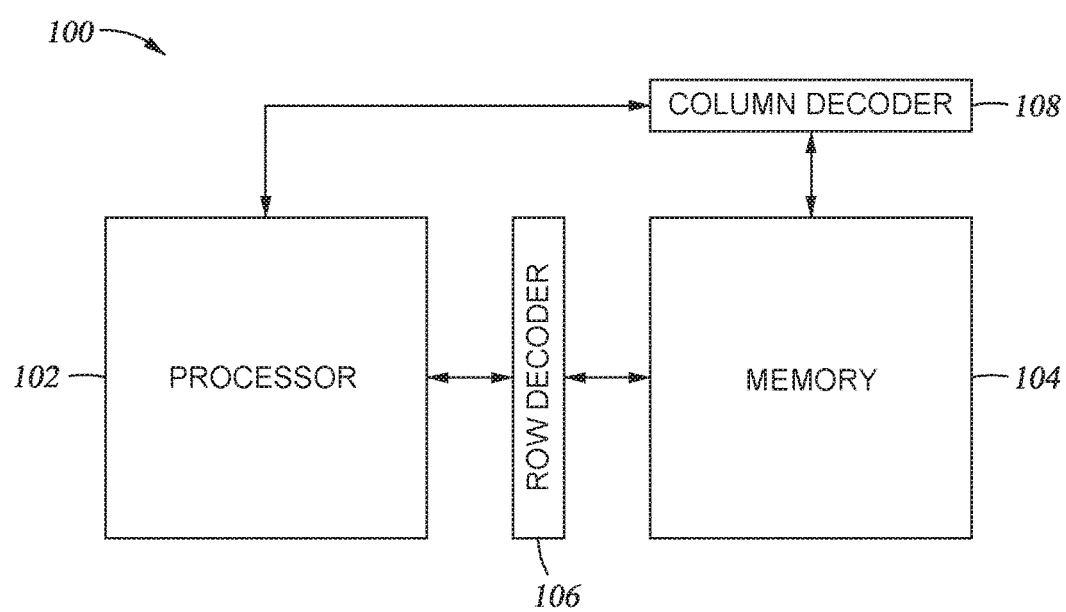
FIG. 1 illustrates a block diagram of an example processing system that may incorporate one or more multi-level cell devices, in accordance with embodiments of the present disclosure.
Figure 2:
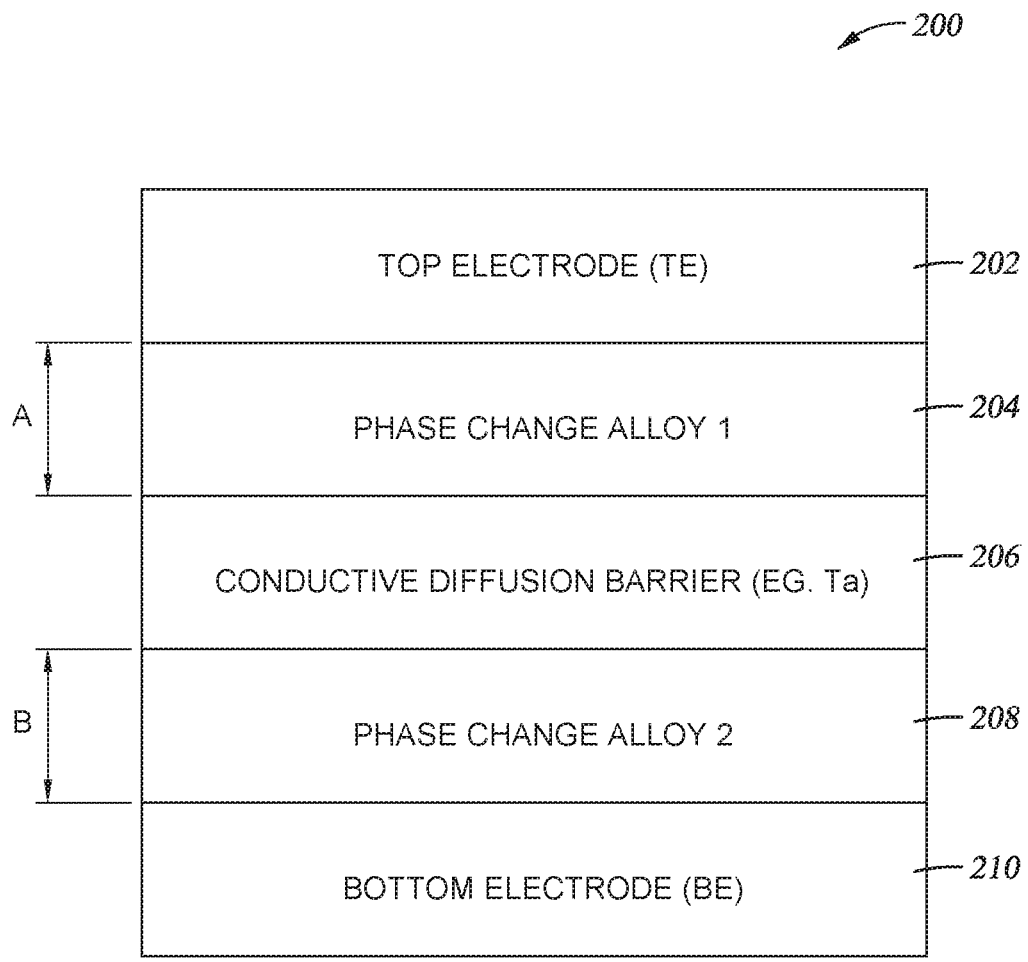
FIG. 2 illustrates an example memory cell device that may be used for multi-bit data storage, in accordance with embodiments of the present disclosure.

FIG. 1 is a block diagram illustrating an example of a processing system 100 that may incorporate one or more devices according to the various embodiments presented herein and/or implement one or more aspects of the present disclosure. For example, as will be described in more detail below, the processing system 100 may incorporate one or more multi-level phase change devices (e.g., as shown in FIG. 2) and may be configured to program, address and/or read each of the one or more multi-level phase change devices in accordance with the techniques presented herein.

As shown, the processing system 100 may include a processor 102, a row decoder 106, a storage device (e.g., memory) 104 and a column decoder 108. The storage device 104 may include a plurality of memory cells (not shown), which may be arranged in an array formation of rows and columns. The processor 102 may interface with the array of memory cells (in the storage device 104) via the row decoder 106 and column decoder 108. Individual memory cells may be programmed or queried via an arrangement of word lines (WLs) and bit lines (BLs). The WLs may extend along the rows of the array and the BLs may extend along the columns of the array. An individual memory cell may exist at a junction between the WLs and BLs. In general, during a read/write cycle, the row decoder 106 may select (e.g., via a selecting device) a row of memory cells to write to or read from. Similarly, the column decoder 108 may select (e.g., via a selecting device) a column address of memory cells for the read/write cycle.

In an embodiment of the present disclosure, each of the memory cells (within the storage device 104) may be a phase change memory (PCM) cell. In this embodiment, for example, each memory cell (e.g., at a junction between the WLs and BLs) may include a PCM cell that may be selected via a selecting device, such as a transistor (e.g., a type of field-effect transistor (FET), a type of bipolar junction transistor (BJT), etc.), diode, and the like. Some examples of FETs may include metal-oxide-semiconductor FETs (MOSFETs), metal-semiconductor FETs (MESFETs), etc. A row of PCM cells may be activated by a single WL and each of the PCM cells in that particular row may affect the BL to which it is electrically connected.

In general, each PCM cell may be programmed (e.g., to store data) by heating the phase change material such that the phase change material is reset into a high (amorphous) resistance state or set into a low (crystalline) resistance state). In some embodiments, the high resistance state may correspond to a '0' data bit and the low resistance state may correspond to a '1' data bit. As will be described in more detail below (e.g., with reference to FIGS. 5A-5B), to transition the phase change material into the amorphous state, a reset pulse of large amplitude (e.g., above the melting temperature of the phase change material) and short duration may be applied to the phase change material in order to melt the phase change material (e.g., into a molten state) and allow the phase change material to rapidly cool such that the phase change material is left in a disordered amorphous state. To transition the phase change material into the crystalline state, a set pulse (of sufficient amplitude to be above the glass transition temperature of the phase change material) may be applied to the phase change material and may be held for a time sufficient to allow the phase change material to crystallize into an ordered low resistance state.

According to certain embodiments presented herein, each of the PCM cells (e.g., within storage device 104) may also be programmed into one or more different (intermediate) resistance states in order to store multiple bits within the PCM cells. FIG. 2, for example, illustrates an example memory cell device 200 that may be used for multi-bit storage of data, according to one embodiment of the present disclosure. In one example, the memory cell device 200 may be one of a plurality of memory cell devices 200 (e.g., with each memory cell device located at a junction between the WLs and BLs) in storage device 104 shown in FIG. 1.

As shown, the memory cell device 200 may include a top surface with a top electrode, such as top electrode (TE) 202, attached to the top surface, a bottom surface with a bottom electrode, such as bottom electrode (BE) 210, attached to the bottom surface, and a cell body that may include a plurality of phase change material layers. For example, as shown in shown in FIG. 2, the cell body (of memory cell device 200) may include at least a first phase change material layer 204 and a second phase change material layer 208. The first phase change material layer 204 and the second phase change material layer 208 may be separated by a diffusion barrier 206. The diffusion barrier 206 may be metallic and may utilize materials such as titanium (Ti), tantalum (Ta), cobalt (Co), nickel (Ni), and alloys thereof that include oxides and nitrides. The diffusion barrier 206 may be used to chemically isolate material layers 204 and 208 while maintaining sufficient electrical conductivity to maintain electronic contacts between the layers. In one example, the diffusion barrier has a resistivity less than 0.01 Ohm cm.

In one embodiment, the TE 202 and BE 210 may not chemically interact with the first phase change material layer 204 and the second phase change material layer 210, respectively. Materials that may be utilized for the TE 202 and BE 210 may include titanium nitride (TiN), tantalum nitride (TaN), and the like. In this manner, interdiffusion between the material layers 204 and 208 (e.g., when the material layers 204 and 208 are in a molten state) and the TE 202 and BE 210, respectively, may be reduced (or prevented).

Although not shown, those of ordinary skill in the art will appreciate that the cell body (of memory cell device 200) may include additional phase change material layers and/or diffusion barriers. Further, it should be noted that (while not shown) each of the different layers of memory cell device 200 may have the same (or different dimensions) compared to other layers within memory cell device 200. In one embodiment, for example, the volume, thickness, etc., of material layers 204 and 208 may be the same or different. For example, as shown in FIG. 2, with A and B referring to thickness levels, material layer 204 may have a thickness level A that is the same or different from a thickness level B of material layer 208. In another example, also shown in FIG. 2, with A and B referring to volume levels, the phase change material used for material layer 204 may have a volume A that is the same or different from a volume level B of a phase change material used for material layer 208. In another embodiment, the thickness of diffusion barrier 206 may be no greater than the thickness of either material layer 204 or material layer 208.

According to certain embodiments, the materials that may be utilized for the phase change material layers 204 and 208 may include any of selenium tellurium (SeTe), silicon tellurium (SiTe), antimony selenide (SbSe), tin selenide (SnSe), tin tellurium (SnTe), tin antimony (SnSb), germanium antimony (GeSb), germanium tellurium (GeTe), silicon antimony (SiSb), germanium antimony tellurium (GeSbTe or GST) and alloys thereof. Each of these phase change materials (and their alloys) may have different material (e.g., electrical and/or thermal) properties, such as different melting point temperatures, different glass transition temperatures, different thermal conductivities, different orders of magnitude between the amorphous and crystalline states, etc.

In some embodiments, the material layers 204 and 208 may utilize the same phase change materials (or the same alloy of a phase change material). In other embodiments, the material layers 204 and 208 may include different phase change materials (or different alloys of the same phase change material). As will be described in more detail below, in some examples, by having different phase change material alloys and/or different driving (e.g., via a sequence of pulses of varying amplitude) of the memory cell device 200, different final resistance states may be achieved for the memory cell device 200.

In some cases, in order to achieve different final resistance states (e.g., to record multiple bits) the melting points (and glass transition temperatures) for any given two alloys of a material used for the phase change material layers 204 and 208 within memory cell device 200 may have a particular relationship. For example, in one embodiment (if two material layers are used as shown in FIG. 2), the melting (and glass transition) temperature(s) for a (first) alloy of a material used for one material layer (e.g., material layer 204 or 208) may be at least 50° degrees Celsius (C) higher but not more than 200° C. higher than the melting (and glass transition) temperature(s) for a (second) alloy of a material used for another material layer (e.g., material layer 204 or 208). In general, this same melting (and glass transition) temperature relationship between different alloys of a material may be applied for more than two material layers. For example, if three alloys of a phase change material are utilized, respectively, in three material layers of a memory cell device, the melting (and glass transition) temperature of the third alloy may be at least 50° C. higher but not more than 200° C. higher than the melting (and glass transition) temperature for the second alloy. In one embodiment, however, the highest melting temperature of any alloy (or phase change material) used within memory cell device 200 may not exceed 600° C. Similarly, the lowest melting temperature of any alloy (or phase change material) used within memory cell device 200 may not be below 100° C.

It should be noted that the above melting (and glass transition) temperature relationship may also be applied for different phase change materials (e.g., SeTe for material layer 204 and GeTe for material layer 208) that may be utilized for any phase change material layers in a memory cell device 200. One may also alter the volumes of the different phase transition materials to alter the dynamics or glass transition temperature for an input electrical signal.

Figure 3A:
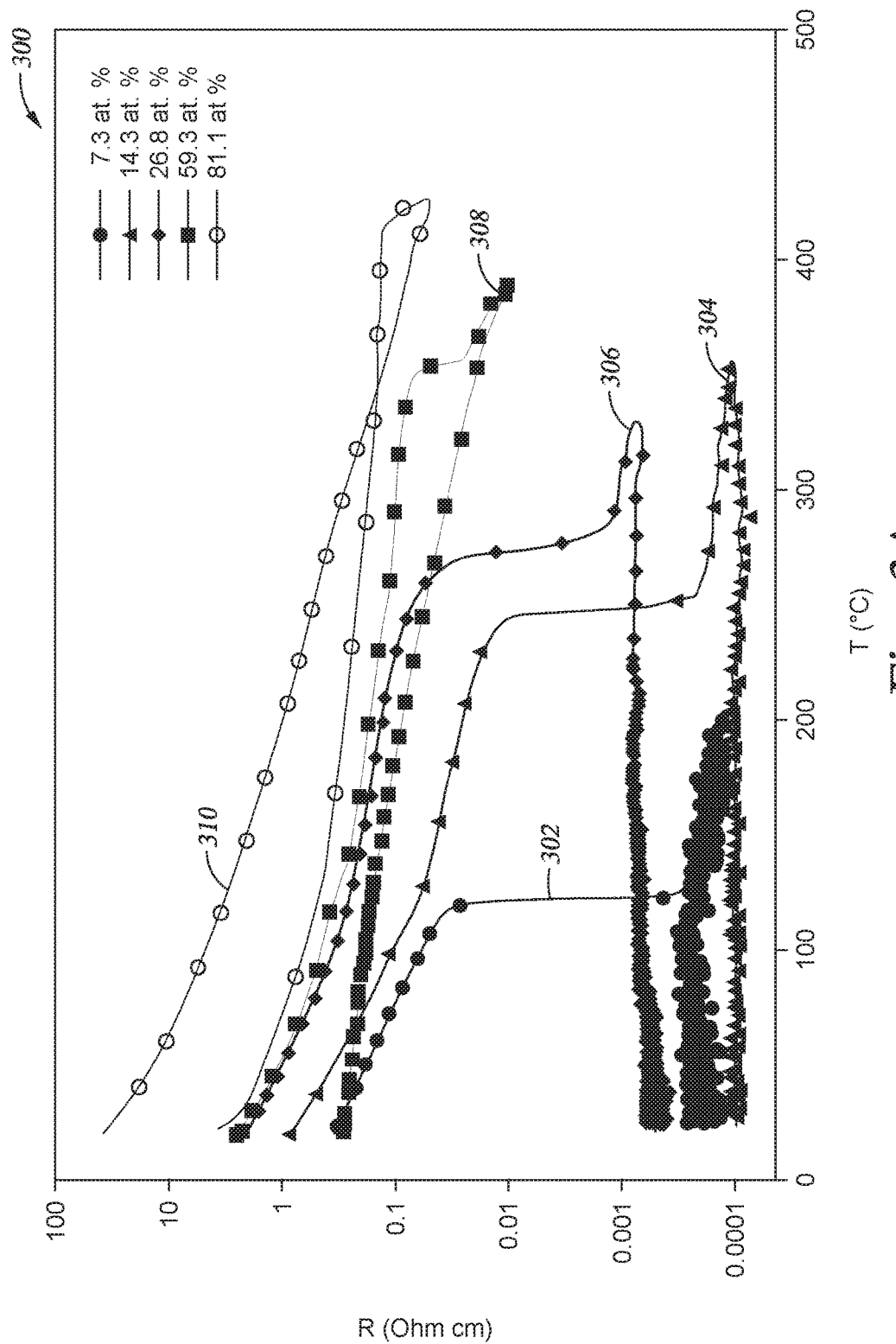
FIG. 3A illustrates an example of melting point transition temperatures for different alloys of a particular phase change material, in accordance with embodiments of the present disclosure.
Figure 3B:
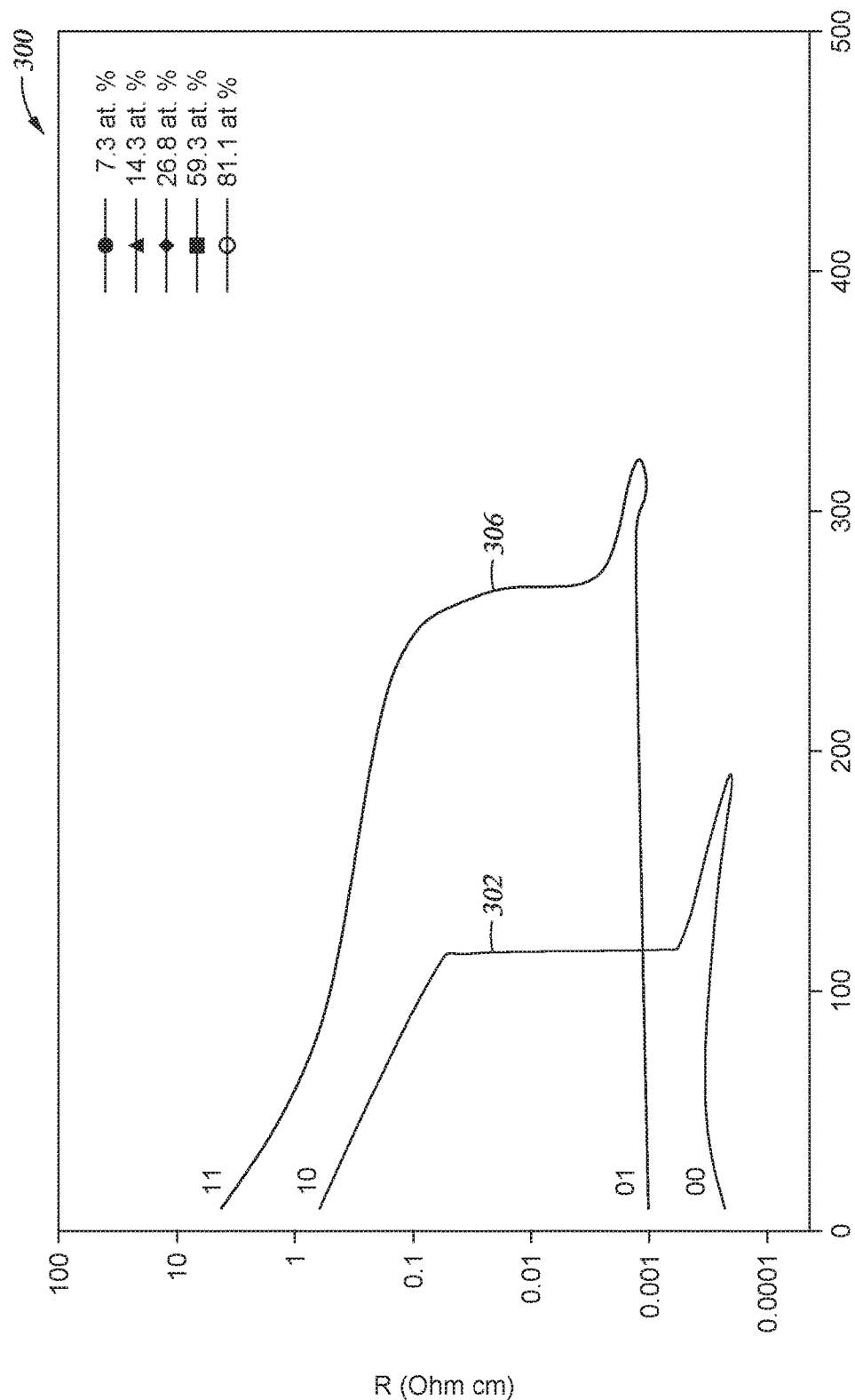
FIG. 3B illustrates an example of melting point transition temperatures for two different alloys of a phase change material that may be used in a memory cell device, in accordance with embodiments of the present disclosure.

FIGS. 3A-3B show a graph 300 that illustrates an example of the resistivity vs. melting point temperatures for different alloys of a phase change material, such as GeSb, according to an embodiment of the present disclosure. For example, in this embodiment, the resistivity (R) vs. temperature (T) of GeSb films with various Ge fractions (in at %) is plotted. The different alloys of the GeSb phase change material may be obtained by varying the percentage of Ge within each GeSb (GS) composition.

As shown in FIG. 3A, graph 300 illustrates a curve 302 that may be representative of a first GS alloy with 7.3% of Ge, a curve 304 that may be representative of a second GS alloy with 14.5% of Ge, a curve 306 that may be representative of a third GS alloy with 26.8% of Ge, a curve 308 that may be representative of a fourth GS alloy with 59.3% of Ge and a curve 310 that may be representative of a fifth GS alloy with 81.1% of Ge.

In an embodiment, each of these curves 302-10 may be obtained by heating up and/or cooling down the various alloys (of the phase change material GeSb) represented by the respective curves. In general, any two of the alloys, shown in FIG. 3A, may be utilized as the phase change materials for the material layers 204 and 208 shown in FIG. 2. For example, as shown in FIG. 3B, according to one embodiment of the present disclosure, the first GS alloy (e.g., represented by curve 302) and the third GS alloy (e.g., represented by curve 306) may be utilized as the phase change materials for the material layers 204 and 208, respectively.

In this particular example, with the use of the first GS alloy and the third GS alloy as the phase change materials within memory cell device 200, techniques described herein may allow for altering one alloy (e.g., the first GS alloy) without altering the other alloy (e.g., the third GS alloy), or altering both alloys in order to address a wider range of different resistance states. In this manner, the memory cell device 200 may be able to access a greater range of intermediate resistances (e.g., dial in any particular resistance state within the range), which may allow for storage of more data bits in the memory cell device 200.

Figure 4:
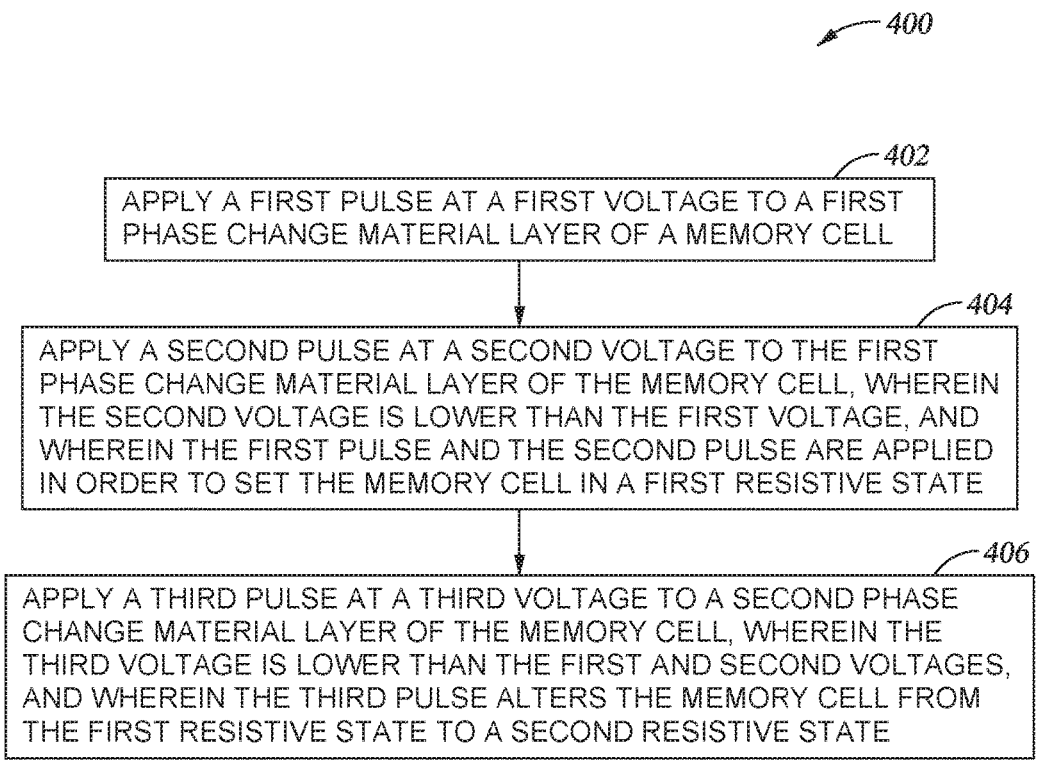
FIG. 4 is a flow diagram of example operations, in accordance with embodiments of the present disclosure.

FIG. 4 is a flow diagram of example operations 400 that (as will be described in more detail below) may be used to program a memory cell device, such as memory cell device 200 shown in FIG. 2, according to an embodiment of the present disclosure. In an embodiment, the operations 400 may be used to send a sequence of different electrical pulses as the voltage (e.g., device temperature) is ratcheted down from the start of a write cycle to the end of a write cycle.

The operations 400 begin, at 402, where a first pulse at a first voltage may be applied to a first phase change material layer of a memory cell. At 404, a second pulse at a second voltage may be applied to the first phase change material layer of the memory cell. In an embodiment, the second voltage may be lower than the first voltage, and the first pulse and the second pulse may be applied in order to set the memory cell in a first resistance state.

At 406, a third pulse at a third voltage is applied to a second phase change material layer of the memory cell. In an embodiment, the third voltage may be lower than the first voltage and second voltages, and the third pulse may alter the memory cell from the first resistance state to a second resistance state. In some cases, as described further below, the second resistance state may be an intermediate resistance state that has an order of magnitude of resistance lower than the first resistance state. In another embodiment, the first pulse, second pulse, and third pulse may be either unipolar or bipolar pulses.

Figure 5A:
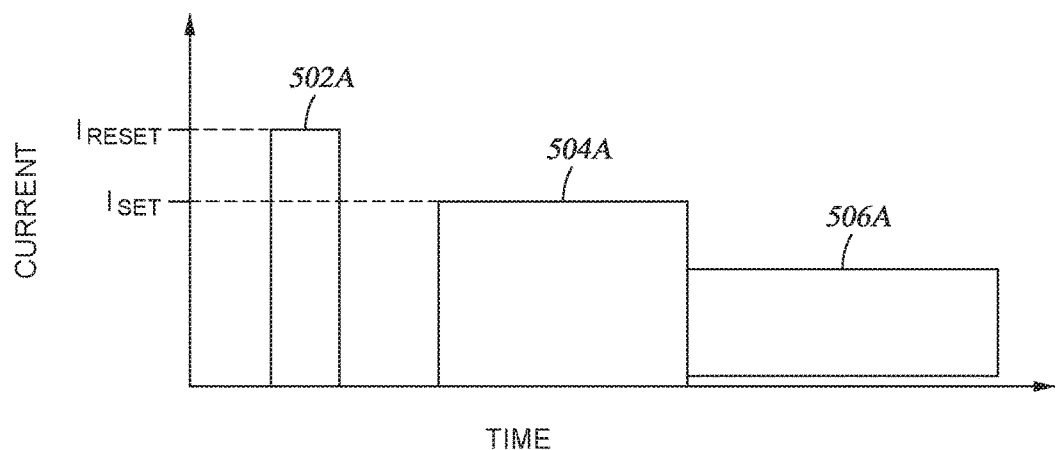
FIGS. 5A and 5B illustrate examples of sequence of pulses that may be applied to a memory cell device, in accordance with embodiments of the present disclosure.
Figure 5B:
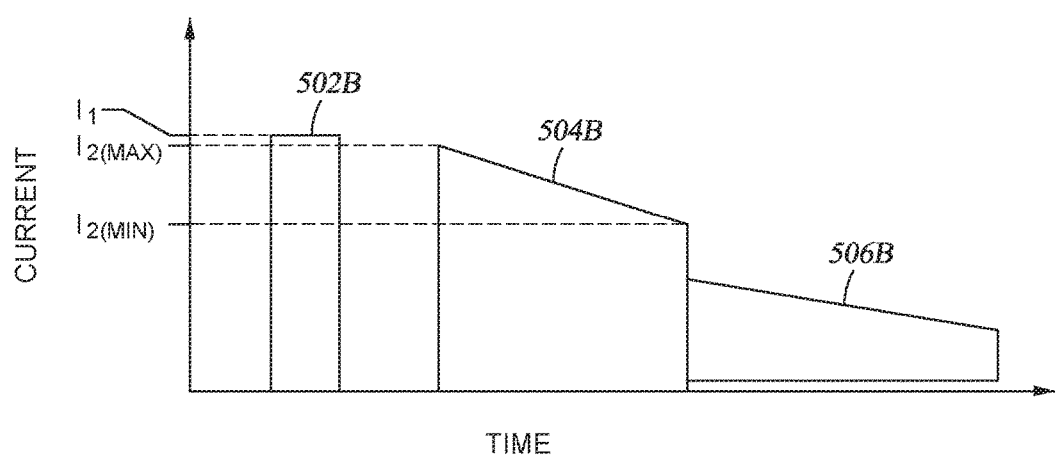

FIGS. 5A and 5B illustrate examples of sequence of pulses 500 that may be applied to different layers of a memory cell device, according to an embodiment of the present disclosure.

According to certain embodiments, the first pulse and the second pulse applied to the first phase change material layer of a memory cell (mentioned above with reference to FIG. 4) may be a reset pulse (e.g., reset pulse 502A or 502B shown in FIGS. 5A-5B) and a set pulse (e.g., set pulse 504A or 504B), respectively. Further, in one embodiment, the first phase change material layer that receives the first pulse and the second pulse may be the third GS alloy (e.g., represented by curve 306 in FIGS. 3A-3B). However, it should be noted that other alloys and/or other materials described herein may be used as the phase change materials.

As mentioned above, and shown in FIGS. 5A-B, the reset pulse may be pulse of large amplitude, such that the pulse is applied at a high enough voltage (e.g., above the melting temperature of the first phase change material) to melt the material (e.g., the third GS alloy represented by curve 306). As also shown, the reset pulse may also be of short duration in order to rapidly cool the first phase change material from the molten state into a disordered amorphous state. Once in the disordered amorphous state, the first phase change material (e.g., third GS alloy) may have a high resistance state. Referring back to FIG. 3B, for example, such a high resistance state for the third GS alloy may be represented by '11' (which approximates a resistance of 5 ohm cm) for the curve 306.

Additionally or alternatively, a set pulse may also be applied to the third GS alloy. As compared to the reset pulse, the set pulse may be a pulse that is applied at a high voltage (e.g., above the material's glass transition temperature but not above its melting point temperature) and held for a time period that is sufficient to transition the material (e.g., third GS alloy) into its crystalline state and allow the material to settle into the crystalline state. Once in the crystalline state, the first phase change material (e.g., third GS alloy) may have a low resistance state. As shown in FIG. 3B, for example, such a low resistance state for the third GS alloy may be represented by '01' (which approximates a resistance of 0.001 ohm cm) for the curve 306.

In certain embodiments, the various pulses (e.g., the reset pulse or set pulse) may be shaped in order to access a number of intermediate resistance states between the high resistance (amorphous) state and low resistance (crystalline). For example, as shown in FIG. 5B, in one embodiment, when transitioning from the high resistance state to the low resistance state, the set pulse 504B may be triangular shaped, which may allow the first phase change material to crystallize into an intermediate resistance state. If the first phase change material happens to be the third GS alloy, for example, as shown in FIG. 3B, the intermediate state may be between the '11' state and '01' state on the curve 306.

As mentioned above, according to certain embodiments, the techniques presented herein may also be used to allow the memory cell device to access a greater amount of intermediate resistance states. As such, in these embodiments, one or more additional pulses may be applied to one or more additional phase change material layers within the memory cell device 200 in order to allow for a high addressability of resistance states for the memory cell device 200.

In one example, the one or more additional pulses may include a third pulse applied to a second phase change material layer of a memory cell (e.g., as described above with reference to FIG. 4). In this example, the second phase change material layer may be the first GS alloy (e.g., represented by curve 302 shown in FIGS. 3A-3B). In an embodiment, the second phase change material (e.g., first GS alloy) may already be in a molten state and therefore the third pulse may be a set pulse (e.g., set pulse 506A or 506B) that is used to set the first GS alloy to some intermediate low (crystalline) state. As shown in FIGS. 5A-B, the third pulse may be applied at a voltage that is lower than the voltages used for the set (and reset) pulses applied to the first material phase change layer. Further, similar to the set and reset pulses applied to the first phase change material layer, the set pulse for the second phase change material layer (e.g., first GS alloy) may also be shaped in order to access a number of intermediate resistance states.

In an embodiment, the third pulse may be used to fine tune the memory cell device to some intermediate state. For example, as shown in FIG. 3B, if the third GS alloy (e.g., represented by curve 306) allows the memory cell device to access the '11' resistance state and the '01' resistance state, the first GS alloy (e.g., represented by curve 302) may be used to tune the memory cell device to some intermediate states (e.g., '10' or '00') between the highest resistance state and lowest resistance state for the third GS alloy. In other words, the first phase change material (e.g., third GS alloy) may be used as a rough tuning knob and the second phase change material (e.g., first GS alloy) may be used as a fine tuning knob.

It should be noted that although the two alloys (e.g., illustrated in FIG. 3B) are shown to be overlapping, those of ordinary skill in the art will appreciate that other alloys (or other phase change materials) may be chosen such that the resistance curve for one alloy is completely within (i.e., does not overlap) the resistance curve for another alloy (or phase change material).

According to certain embodiments, if the third pulse is used to set (or program) the first GS alloy to some intermediate state, then during a read operation, it may be possible to measure the convolution of the addition of the two materials such that more than one bit (e.g., based on the intermediate states accessed by the fine tuning) may be determined.

Accordingly, the devices, techniques and systems disclosed herein may allow for a high addressability of resistance states for devices that utilize phase change material to store data. The speed of storing data is also important, so the duration of the first, second, and third pulses should be less than 10 μs. The pulse train duration could be longer than 10 μs, but the technological relevance of a slow writing data storage system will be low. In one example, the duration of the first pulse, the second pulse and the third pulse is longer than 10 ns and shorter than 10 μs.

While the foregoing is directed to embodiments of the present disclosure, other and further embodiments of the disclosure may be devised without departing from the basic scope thereof, and the scope thereof is determined by the claims that follow.

The various illustrative logical blocks, modules, and circuits described in connection with the disclosure herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various operations of methods described above may be performed by any suitable means capable of performing the corresponding functions. The means may include various hardware and/or software component(s).

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for programming a memory cell, comprising: changing the memory cell to a first resistance state by providing a first voltage to the memory cell; and changing the memory cell to a second resistance state by providing a second voltage to the memory cell, wherein the memory cell comprises a first phase change material layer separated from a second phase change material layer by a diffusion barrier layer wherein at least one of the first phase change material layer and the second phase change material layer comprises any of selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb), wherein the first phase change material layer and the second phase change material layer comprise different alloys of the same phase change material, wherein altering a resistance state of the memory cell through application of the first voltage comprises setting the memory cell to a first resistance state, and altering the resistance state of the memory cell through application of the second voltage comprises transitioning the memory cell from the first resistance state to a second resistance state.

2. The method of claim 1, wherein a first alloy of the first phase change material layer and a second alloy of the second phase change material layer have different glass transition temperatures, and wherein a glass transition temperature for the first alloy is at least 50 degrees Celsius greater but not more than 200 degrees Celsius greater than a glass transition temperature for the second alloy.

3. The method of claim 1, wherein the first phase change material layer and the second change material layer comprise different ones of selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb).

4. The method of claim 1, wherein first voltage has a first amplitude and the second voltage has a second amplitude less than the first amplitude.

5. A memory cell device, comprising:
a top surface with a top electrode attached to the top surface;
a bottom surface with a bottom electrode attached to the bottom surface; and
a cell body between the top surface and the bottom surface, wherein the cell body comprises:
a diffusion barrier;
a first means for altering a resistance state of the memory cell device through application of a first voltage; and
a second means for altering the resistance state of the memory cell device through application of a second voltage wherein at least one of a first phase change material layer for the first means and a second phase change material layer for the second means comprises any of selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb), wherein the first phase change material layer and the second phase change material layer comprise different alloys of the same phase change material, wherein altering the resistance state of the memory cell device through application of the first voltage comprises setting the memory cell to a first resistance state, and altering the resistance state of the memory cell device through application of a second voltage comprises transitioning the memory cell from the first resistance state to a second resistance state.

6. The memory cell device of claim 5, wherein the diffusion barrier has a resistivity less than 0.01 Ohm-cm.

7. The memory cell device of claim 5, wherein at least one of the top electrode and the bottom electrode does not chemically interact with the cell body.

8. The memory cell device of claim 5, wherein a first alloy of the first phase change material layer and a second alloy of the second phase change material layer have different glass transition temperatures.

9. The memory cell device of claim 8, wherein a glass transition temperature for the first alloy is at least 50 degrees Celsius greater but not more than 200 degrees Celsius greater than a glass transition temperature for the second alloy.

10. The memory cell device of claim 5, wherein the first phase change material layer for the first means and the second change material layer for the second means comprise different ones of selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb).

11. A system, comprising:
a storage device comprising a plurality of memory cells, wherein each of the plurality of memory cells comprises a first phase change material layer separated from a second phase change material layer by a diffusion barrier wherein at least one of the first phase change material layer and the second phase change material layer comprises any selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb); and a processor configured communicatively coupled with the plurality of memory cells, the processor is configured to:

provide a first voltage to each of the plurality of memory cells to change each of the plurality memory cells to a first resistance state; and provide a second voltage to each of the plurality of memory cells to change each of the plurality of memory cells to a second resistance state, wherein the first phase change material layer and the second phase change material layer comprise different alloys of the same phase change material, wherein altering a resistance state of the plurality of memory cells through application of the first voltage comprises setting the plurality of memory cells to the first resistance state, and altering the resistance state of the plurality of memory cells through application of the second voltage comprises transitioning the plurality of memory cells from the first resistance state to the second resistance state.

12. The system of claim 11, wherein the diffusion barrier layer has a resistivity less than 0.01 Ohm-cm.

13. The system of claim 11, wherein each of the plurality of memory cells further comprises:

a top surface with a top electrode attached to the top surface; and a bottom surface with a bottom electrode attached to the bottom surface, wherein the first phase change material layer, the second phase change material layer and the diffusion barrier are disposed between the top surface and the bottom surface.

14. The system of claim 13, wherein at least one of the top electrode and the bottom electrode does not does not chemically interact with the first phase change material, the second phase change material and the diffusion barrier.

15. The system of claim 11, wherein a first alloy of the first phase change material layer has a first glass transition temperature and a second alloy of the second phase change material has a second glass transition temperature, wherein the first glass transition temperature is at least 50 Celsius degrees greater but not more than 200 degrees Celsius greater than the second glass transition temperature.

16. The system of claim 11, wherein providing the first voltage to each of the plurality of memory cells to change each of the plurality memory cells to a first resistance state comprises providing the first voltage to the first phase change material layer, and providing the second voltage to each of the plurality of memory cells to change each of the plurality of memory cells to the second resistance state comprises provide the second voltage to the second phase change material layer.

17. The system of claim 11, wherein the system further comprises: a row decoder and a column decoder communicatively coupled between the processor and the plurality of memory cells.

18. The system of claim 11, wherein the first resistance state is different from the second resistance state.

19. A storage device comprising:

a plurality of memory cell devices, wherein each of the plurality of memory cell devices comprises:

a top electrode;

a bottom electrode; and a cell body disposed between the top electrode and the bottom electrode, wherein the cell body comprises:

a first phase change material layer;

a second phase change material layer, wherein at least one of the first phase change material layer and the second phase change material layer comprises selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb), wherein the first phase change material layer and the second phase change material layer comprise different alloys of the same phase change material, wherein altering a resistance state of the plurality of memory cell devices through application of a first voltage comprises setting the memory cell to a first resistance state, and altering the resistance state of the plurality of memory cell devices through application of a second voltage comprises transitioning the memory cell from the first resistance state to a second resistance state; and a diffusion barrier disposed between the first phase change material layer and the second phase change material layer.

20. The storage device of claim 19, wherein at least one of the top electrode and the bottom electrode does not does not chemically interact with the first phase change material, the second phase change material and the diffusion barrier.

21. The storage device of claim 19, wherein the first phase change material layer and the second change material layer comprise different ones of selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb).

22. A memory system comprising:

means for providing a first voltage to a first phase change material layer of a memory cell; and means for providing a second voltage to a second phase change material layer of the memory cell, wherein the first phase change material layer is separated from the second phase change material layer by a diffusion barrier, and wherein at least one of the first phase change material layer and the second phase change material layer comprises selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb), wherein the first phase change material layer and the second phase change material layer comprise different alloys of the same phase change material, wherein altering a resistance state of the memory cell through application of the first voltage comprises setting the memory cell to a first resistance state, and altering the resistance state of the memory cell through application of the second voltage comprises transitioning the memory cell from the first resistance state to a second resistance state.

23. The system of claim 22, wherein the first phase change material layer and the second change material layer comprise different ones of selenium tellurium (SeTe), silicon tellurium (SiTe), antimony selenide (SbSe), tin selenide (SnSe), tin tellurium (SnTe), tin antimony (SnSb), germanium antimony (GeSb) and silicon antimony (SiSb).

* * * * *